(12) United States Patent
Suemitsu

(10) Patent No.: US 10,741,369 B2
(45) Date of Patent: Aug. 11, 2020

(54) SEMICONDUCTOR MANUFACTURING APPARATUS

(71) Applicant: Toshiba Memory Corporation, Minato-ku (JP)

(72) Inventor: Ryo Suemitsu, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/264,884

(22) Filed: Feb. 1, 2019

(65) Prior Publication Data

US 2019/0164732 A1 May 30, 2019

Related U.S. Application Data

(63) Continuation of application No. 14/837,167, filed on Aug. 27, 2015, now abandoned.

(60) Provisional application No. 62/172,983, filed on Jun. 9, 2015.

(51) Int. Cl.
*H01J 37/32* (2006.01)

(52) U.S. Cl.
CPC .. *H01J 37/32963* (2013.01); *H01J 37/32477* (2013.01); *H01J 37/32623* (2013.01); *H01J 37/32935* (2013.01); *H01J 37/32972* (2013.01)

(58) Field of Classification Search
CPC .......... H01J 37/32972; H01J 37/32963; H01J 37/32935; H01J 2237/334; H01J 37/3299; H01J 37/32981; H01J 37/32926; H01J 37/32623; H01J 37/32477; H01L 22/26; H01L 21/67253; H01L 21/67069; H01L 21/31116; C23C 16/52

USPC .......... 216/59, 60, 84; 156/345.24, 345.25; 118/712, 713, 714
See application file for complete search history.

(56) References Cited

U.S. PATENT DOCUMENTS

| | | | |
|---|---|---|---|
| 5,322,590 A | 6/1994 | Koshimizu | |
| 8,342,122 B2 | 1/2013 | Dhindsa | |
| 9,017,526 B2 | 4/2015 | Singh et al. | |
| 2003/0170984 A1* | 9/2003 | Yamamoto | H01J 37/32935 438/689 |
| 2005/0020073 A1* | 1/2005 | Perry | G01N 21/272 438/689 |
| 2011/0011743 A1 | 1/2011 | Cruse | |
| 2015/0044873 A1 | 2/2015 | Kellogg | |

FOREIGN PATENT DOCUMENTS

| | | |
|---|---|---|
| JP | 2014-41827 | 3/2014 |
| JP | 2015-19064 | 1/2015 |
| JP | 2015-38987 | 2/2015 |

OTHER PUBLICATIONS

Quartz transmission spectra from https://www.pgo-online.com/intl/curves/quartz-glass-transmission.html.

* cited by examiner

*Primary Examiner* — Rudy Zervigon
(74) *Attorney, Agent, or Firm* — Oblon, McClelland, Maier & Neustadt, L.L.P.

(57) ABSTRACT

A semiconductor manufacturing apparatus according to an embodiment comprises a chamber capable of containing a substrate therein. A mount part can have the substrate mounted thereon. A first member is provided between an inner wall of the chamber and a plasma generation region above the mount part. An optical transmitter is provided in an opening that is provided in the first member to extend from a side of the inner wall of the chamber to the plasma generation region or provided in gaps between a plurality of the first members.

9 Claims, 8 Drawing Sheets

SEMICONDUCTOR MANUFACTURING APPARATUS

CROSS REFERENCE TO RELATED APPLICATIONS

This application is a continuation of U.S. application Ser. No. 14/837,167 filed Aug. 27, 2015 and is based upon and claims the benefit of priority from the prior U.S. Provisional Patent Application No. 62/172,983, filed on Jun. 9, 2015, the entire contents of each of which are incorporated herein by reference.

FIELD

The embodiments of the present invention relate to a semiconductor manufacturing apparatus.

BACKGROUND

In a dry etching apparatus using plasma such as a RIE (Reactive Ion Etching) apparatus, deposits adhere to an inner wall of a reaction chamber when a substrate is processed. When these deposits are accumulated, the deposits may adhere as particles onto substrates that are subsequently processed. If the deposits adhere onto the substrates, patterns as designed are not formed on the substrates, thereby becoming a cause of a malfunction.

To suppress adherence of these deposits to the inner wall of the reaction chamber, a confinement ring that separates between a plasma generation region in the reaction chamber and the inner wall of the reaction chamber is sometimes provided. The confinement ring suppresses the adherence of deposits to the inner wall of the reaction chamber and also suppresses deposits having adhered to the inner wall of the reaction chamber from inversely penetrating into the plasma generation region to adhere onto the substrate.

However, when an end point of etching processing is to be detected based on a plasma emission intensity, the confinement ring becomes an obstruction while light of plasma emission is collected, and thus becomes a cause of interference to detection of the plasma emission intensity. Therefore, it is sometimes difficult for an etching apparatus having the confinement ring to accurately detect the end point of etching processing.

DETAILED DESCRIPTION

Embodiments will now be explained with reference to the accompanying drawings. The present invention is not limited to the embodiments.

A semiconductor manufacturing apparatus according to an embodiment comprises a chamber capable of containing a substrate therein. A mount part can have the substrate mounted thereon. A first member is provided between an inner wall of the chamber and a plasma generation region above the mount part. An optical transmitter is provided in an opening that is provided in the first member to extend from a side of the inner wall of the chamber to the plasma generation region or provided in gaps between a plurality of the first members.

First Embodiment

Figure 1:
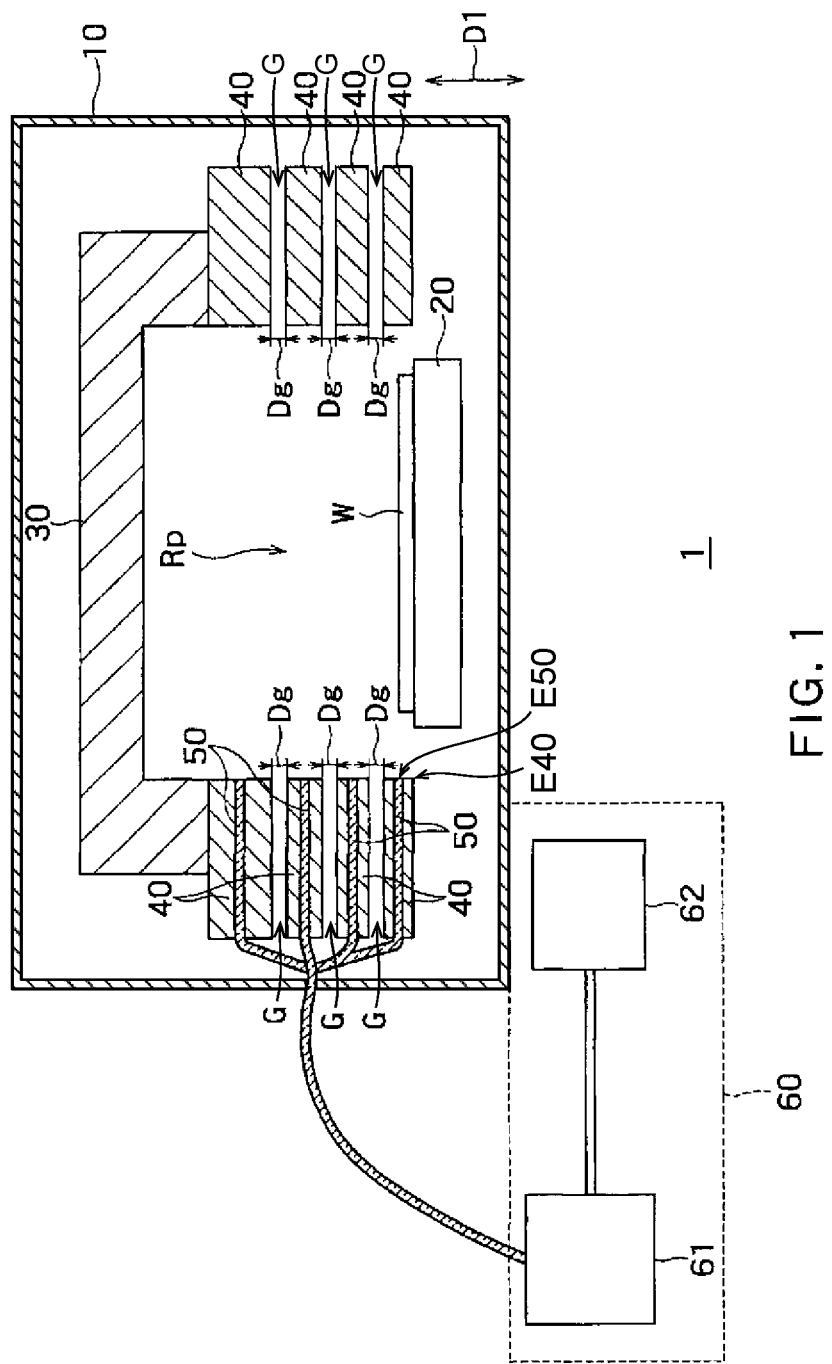
FIG. 1 shows an example of a configuration of a dry etching apparatus 1 according to a first embodiment.

FIG. 1 shows an example of a configuration of a dry etching apparatus 1 (hereinafter, also simply "apparatus 1") according to a first embodiment. The apparatus 1 includes a reaction chamber 10, a stage 20, an upper electrode 30, confinement rings 40, optical transmitters 50, and an optical analyzer 60. Illustrations of a vacuum pump, an etching gas supplier, and a gas discharger are omitted.

The apparatus 1 is a semiconductor manufacturing apparatus that processes a semiconductor substrate W using plasma, such as a RIE apparatus or a plasma CVD (Chemical Vapor Deposition) apparatus.

The reaction chamber 10 serving as a holder holds therein the stage 20, the upper electrode 30, and the confinement rings 40 and the inside of the reaction chamber 10 is in a reduced pressure state. The reaction chamber 10 can hold therein the semiconductor substrate W when the semiconductor substrate W is to be processed.

The stage 20 serving as a mount part is configured to be capable of having the semiconductor substrate W mounted thereon when the semiconductor substrate W is to be processed. The stage 20 functions also as one of electrodes for generating plasma.

The upper electrode 30 functions as the other electrode for generating plasma. Plasma is generated by ionizing etching gas with power applied by the stage 20 and the upper electrode 30. Therefore, plasma is generated in a plasma generation region Rp between the stage 20 and the upper electrode 30.

The confinement rings 40 serving as first members are provided between an inner wall of the reaction chamber 10 and the plasma generation region Rp above the stage 20. The confinement rings 40 are provided to suppress deposits generated due to etching processing from adhering to the inner wall of the reaction chamber 10. Therefore, the confinement rings 40 are provided around the plasma generation region Rp along the inner wall of the reaction chamber 10 or along an outer circumference of the stage 20 in planes substantially parallel to the surface of the stage 20. While having a ring shape in the planes substantially parallel to the surface of the stage 20 in the first embodiment, the confinement rings 40 do not always need to have a ring shape. It suffices that the confinement rings 40 can suppress adherence of deposits to the inner wall of the reaction chamber 10 and also can suppress penetration of deposits on the inner wall of the reaction chamber 10 into the plasma generation region Rp.

The confinement rings 40 are arrayed in a direction D1 substantially perpendicular to the surface of the stage 20. The confinement rings 40 are configured to be movable in the direction D1. Accordingly, a distance Dg between the confinement rings 40 can be changed according to the pressure of the etching gas and the flow rate thereof. For example, when the pressure and the flow rate of the etching gas are relatively high, the confinement rings 40 are moved in the direction D1 to cause the distance Dg therebetween to be relatively large. A large amount of gas having been used for etching and being no longer needed can be thereby easily discharged from gaps G between the confinement rings 40. That is, even when the pressure and the flow rate of the etching gas are relatively high, the confinement rings 40 do not interfere with discharge of gas. On the other hand, when the pressure and the flow rate of the etching gas are relatively low, the confinement rings 40 are moved in the direction D1 to cause the distance Dg therebetween to be relatively small. In this case, the amount of gas having been used for etching and being no longer needed is relatively small and thus can be sufficiently discharged from the gaps G. By causing the distance Dg to be relatively small, deposits become more likely to adhere to the confinement rings 40 and less likely to adhere to the inner wall of the reaction chamber 10. Furthermore, by causing the distance Dg to be relatively small, deposits having adhered to the inner wall of the reaction chamber 10 become less likely to penetrate into the plasma generation region Rp in which the semiconductor substrate W is placed. In this way, the distance Dg between the confinement rings 40 can be changed according to the pressure and the flow rate of the etching gas.

The optical transmitters 50 are attached to (embedded in) openings provided in the confinement rings 40 from the side of the inner wall of the reaction chamber 10 toward the plasma generation region Rp, respectively. Ends (end faces) E50 of the optical transmitters 50 face the plasma generation region Rp and are positioned to be substantially flush with ends E40 of the confinement rings 40 on the side of the plasma generation region Rp, respectively. The optical transmitters 50 extend from the ends E40 of the confinement rings 40 toward the reaction chamber 10 and pass through the reaction chamber 10 to be connected to the optical analyzer 60. The optical transmitters 50 are constituted of optical fibers, for example, and can collect light of plasma emission generated in the plasma generation region Rp to transmit the light to the optical analyzer 60.

The optical transmitters 50 are provided in the confinement rings 40, respectively, and are placed at different positions in the direction D1, respectively. Accordingly, the optical transmitters 50 can transmit the light of plasma emission at different positions (heights) in the direction D1 above the semiconductor substrate W.

Figure 2:
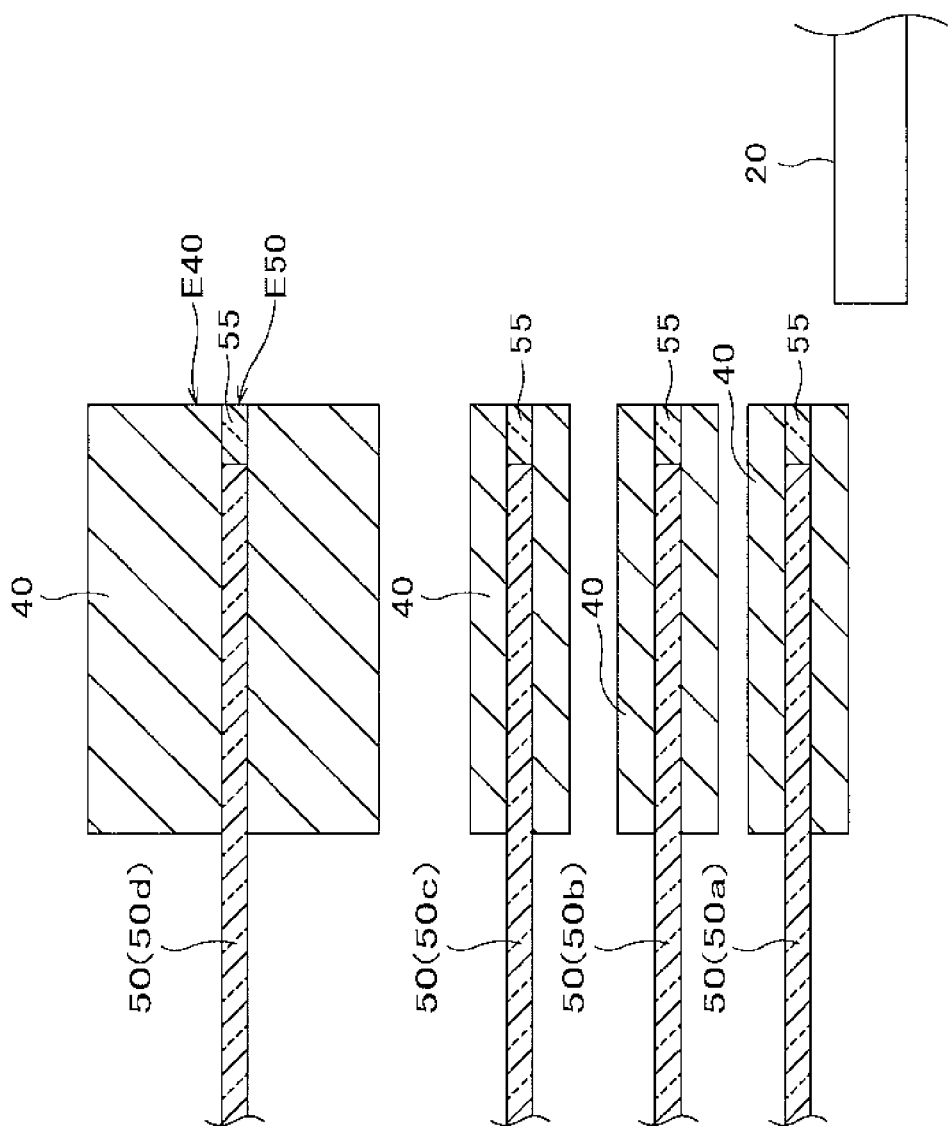
FIG. 2 shows the ends E40 of the confinement rings 40 and the ends E50 of the optical transmitters 50 in more detail.

A dielectric film 55 can be provided on the surfaces of the ends E50 of the optical transmitters 50 as shown in FIG. 2. FIG. 2 shows the ends E40 of the confinement rings 40 and the ends E50 of the optical transmitters 50 in more detail. The dielectric film 55 functions as a protection film and/or an antireflection film for the optical transmitters 50 and can be, for example, $Al_2O_3$, sapphire, or a silicon nitride film. The dielectric film 55 can suppress damage of the optical transmitters 50 due to plasma. Furthermore, even when deposits adhere to the dielectric film 55, the deposits can be removed from the dielectric film 55 by ashing.

The optical analyzer 60 is connected to the optical transmitters 50 and analyzes plasma emission generated in the plasma generation region Rp. The optical analyzer 60 includes a spectrometry part 61 and a computing part 62. The spectrometry part 61 splits the plasma emission according to wavelength bands using a diffraction grating and detects plasma emission of the respective wavelength bands using photodetection elements such as CCD (Charge Coupled Device) elements. The spectrometry part 61 can be, for example, an OES (Optical Emission Spectrometry) apparatus. The computing part 62 analyzes components of gas in the plasma generation region Rp based on emission intensities of the plasma emission of the respective wavelength bands detected by the spectrometry part 61. For example, the computing part 62 can be a personal computer. The computing part 62 detects end of etching based on changes in the gas components in the plasma generation region Rp (end point detection). For example, when a silicon dioxide film is to be etched, CF-based etching gas is used and thus the amount of COx (x is an integer) is reduced when almost the entire silicon dioxide film is etched. Therefore, it suffices that the computing part 62 monitors a gas component of COx via the plasma emission and determines that etching is ended when the amount of COx falls below a predetermined value. This enables the silicon dioxide film to be etched in just proportion.

In this example, in the apparatus 1 according to the first embodiment, the optical transmitters 50 are incorporated (embedded) inside the confinement rings 40 in the reaction chamber 10 rather than outside the reaction chamber 10. The ends E50 of the optical transmitters 50 face from the confinement rings 40 toward the plasma emission region Rp. Accordingly, the optical transmitters 50 can receive plasma emission generated in the plasma generation region Rp without being interrupted by the confinement rings 40.

If the optical transmitters 50 are provided outside the reaction chamber 10, there are cases where plasma emission is interrupted by the confinement rings 40 and thus the optical transmitters 50 cannot receive sufficient emission to detect the end point of etching. For example, when the pressure and the flow rate of etching gas are relative high and the distance Dg between the confinement rings 40 is relatively large, plasma emission reaches from the gaps G between the confinement rings 40 to the optical transmitters 50 at a relatively high intensity. However, when the pressure and the flow rate of the etching gas are relatively low and the distance Dg between the confinement rings 40 is relatively small, plasma emission reaches from the gaps G between the confinement rings 40 to the optical transmitters 50 only at a relatively low intensity. In this case, it is difficult for the optical analyzer 60 to catch changes in the gas components in the plasma generation region Rp and may affect detection of the end point of etching.

Figure 3:
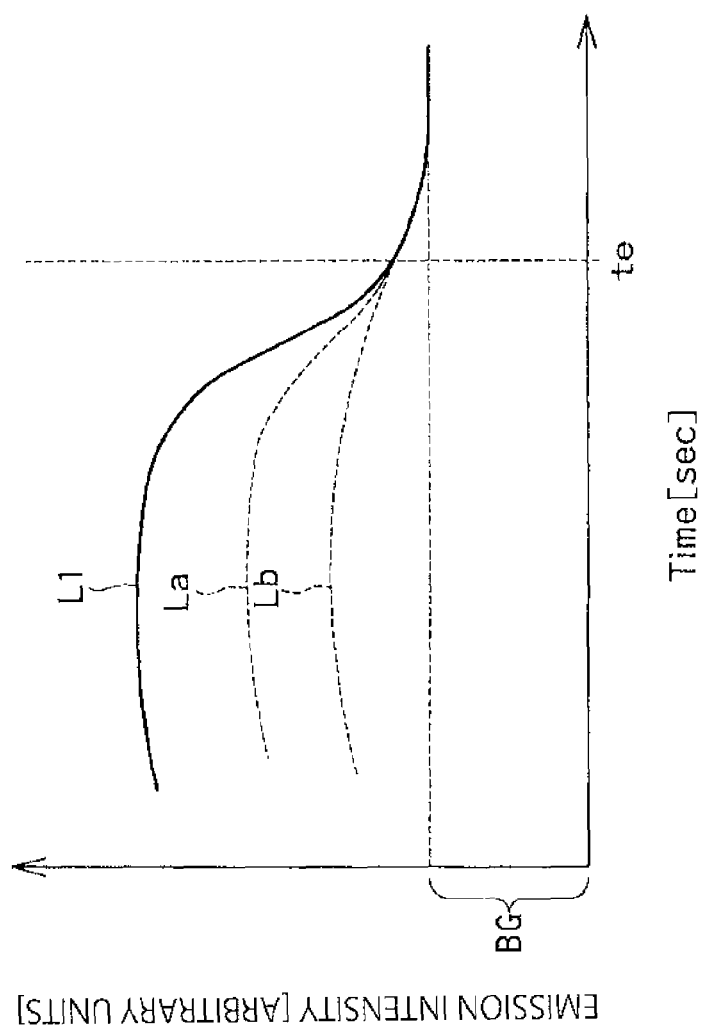
FIG. 3 is a graph showing the plasma emission intensity of a COx component in etching processing of a silicon dioxide film.

For example, FIG. 3 is a graph showing the plasma emission intensity of a COx component in etching processing of a silicon dioxide film. The vertical axis represents the plasma emission intensity of the COx component and the horizontal axis represents the time. Lines La and Lb indicate plasma emission intensities in a case where the optical transmitters 50 are provided outside the reaction chamber 10. The line La indicates a plasma emission intensity in a case where the pressure and the flow rate of etching gas are relatively high and the line Lb indicates a plasma emission intensity in a case where the pressure and the flow rate of etching gas are relatively low. As indicated by the line La, when the pressure and the flow rate of the etching gas are high, the distance Dg between the confinement rings 40 is widened and thus the plasma emission intensity is relatively high, which enables the optical analyzer 60 to catch a change in the COx component at a time te. However, when the pressure and the flow rate of the etching gas are low, the distance Dg between the confinement rings 40 is narrowed and thus the plasma emission intensity is relative low as indicated by the line Lb, so that it becomes difficult for the optical analyzer 60 to catch changes in the COx component. In this case, detection of the end point of etching becomes difficult.

On the other hand, a line L1 is a graph obtained by using the apparatus 1 according to the first embodiment. In the apparatus 1 according to the first embodiment, because the optical transmitters 50 are incorporated (embedded) inside the confinement rings 40, the optical transmitters 50 can receive plasma emission at positions quite close to the plasma generation region Rp regardless of the positions of the confinement rings 40. Therefore, the optical transmitters 50 can receive the plasma emission at intensities having sufficiently high absolute values and thus can obtain changes in the intensity of the plasma emission reliably (at a high sensitivity). For example, in FIG. 3, the line L1 shows that the plasma emission intensity is greatly reduced at the time te. That is, the amount of COx in the plasma generation region Rp is greatly reduced at the time te and it is clearly known that almost the entire silicon dioxide film has been etched. Therefore, the optical analyzer 60 can easily determine that the time te is the end point of the etching processing.

Furthermore, according to the first embodiment, the optical transmitters 50 are provided in the confinement rings 40, respectively. The optical transmitters 50 can thereby receive plasma emission at positions (heights) different in the direction D1. This enables the optical analyzer 60 to perform detection of the end point of etching based on an analysis result of the plasma emission at the positions different in heights. For example, as shown in FIG. 2, among the optical transmitters 50, an optical transmitter that is the closest to the stage 20 (the semiconductor substrate W) is referred to as "first optical transmitter 50a", an optical transmitter that is the next closest to the stage 20 after the first optical transmitter 50a is referred to as "optical transmitter 50b", an optical transmitter that is the next closest to the stage 20 after the optical transmitter 50b is referred to as "optical transmitter 50c", and an optical transmitter that is the farthest from the stage 20 (the semiconductor substrate W) is referred to as "second optical transmitter 50d". In this case, plasma emission received by the first optical transmitter 50a changes the earliest after the end of etching. Plasma emission received by the optical transmitters 50b and 50c subsequently changes and plasma emission received by the second optical transmitter 50d changes last. Accordingly, the optical analyzer 60 can perform detection of the end point of etching processing based on the difference between the intensity of plasma emission obtained from the first optical transmitter 50a and the intensity of plasma emission obtained from the second optical transmitter 50d. This enables noise or background components (BG in FIG. 3) to be removed from the plasma emission obtained from the first optical transmitter 50a, thereby prominently detecting changes in the plasma emission intensity. Needless to say, the optical analyzer 60 can detect the end point of etching processing using the difference between intensities of plasma emission obtained from any two of the optical transmitters 50a to 50d, rather than only the difference between the intensities of plasma emission obtained from the optical transmitters 50a and 50d.

The optical analyzer 60 can determine that etching processing has ended when the intensity or the intensities of plasma emission obtained from one or a plurality of the optical transmitters 50a to 50d have fallen below a predetermined value. For example, the optical analyzer 60 can determine that etching processing has ended when the intensity of plasma emission from the optical transmitter 50a has fallen below the predetermined value. Alternatively, the optical analyzer 60 can determine that etching processing has ended when the intensities of plasma emission obtained from any two of the optical transmitters 50a to 50d have fallen below the predetermined value.

(First Modification)

Figure 4:
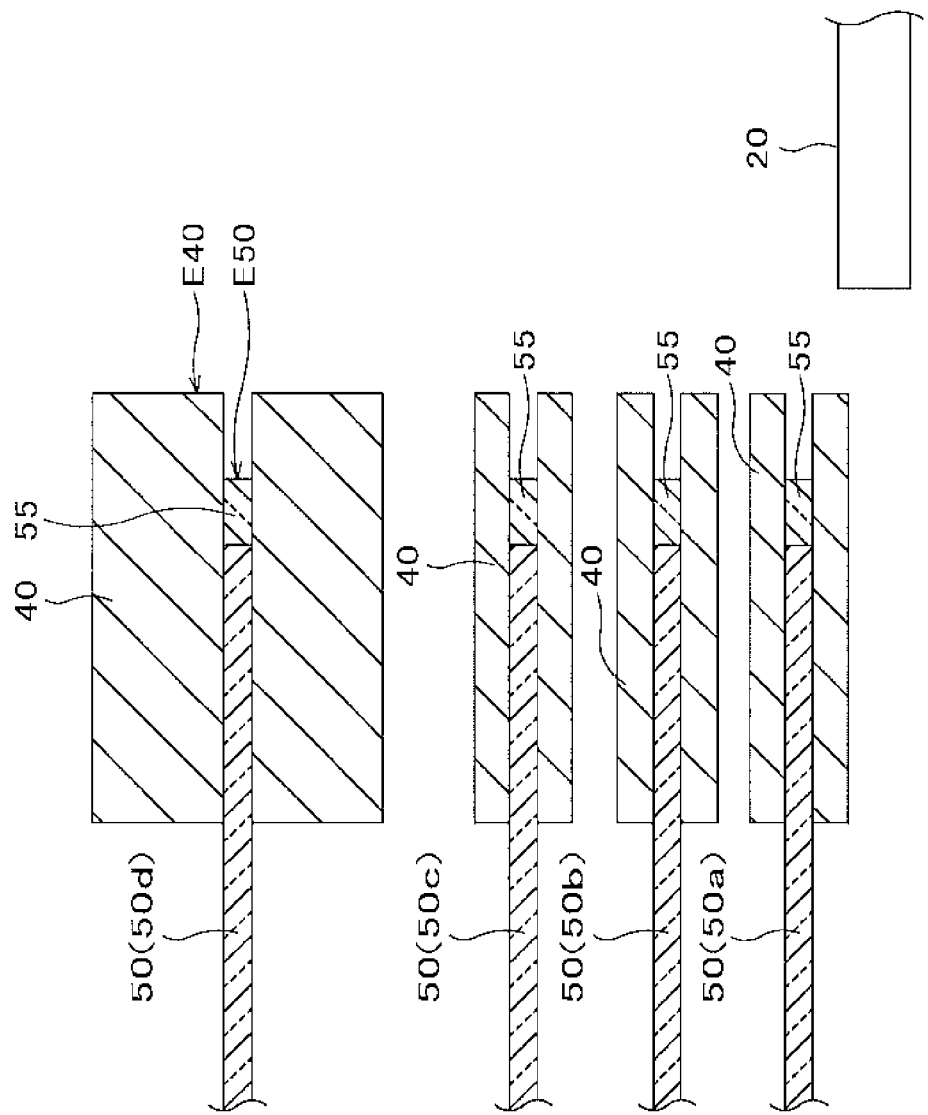
FIG. 4 shows an example of a configuration of the confinement rings 40 and the optical transmitters 50 according to a first modification of the first embodiment.

FIG. 4 shows an example of a configuration of the confinement rings 40 and the optical transmitters 50 according to a first modification of the first embodiment. In the first modification, the ends E50 of the optical transmitters 50 are positioned on the side nearer the reaction chamber 10 than the ends E40 of the confinement rings 40. Accordingly, the optical transmitters 50 become less likely to be subject to plasma damage. Furthermore, deposits are less likely to adhere to the ends E50 of the optical transmitters 50. When the optical transmitters 50 are sufficiently protected from plasma damage by the ends E40 of the confinement rings 40, the dielectric film 55 does not always need to be provided.

In the first modification, because the ends E50 of the optical transmitters 50 are retracted behind the ends E40 of the confinement rings 40, the intensities of plasma emission received by the optical transmitters 50 are somewhat reduced. However, as compared to a case where the optical transmitters 50 are provided outside the reaction chamber 10, the optical transmitters 50 according to the first modification can receive relatively intense plasma emission. Therefore, the first modification can achieve effects identical to those of the first embodiment.

(Second Modification)

Figure 5:
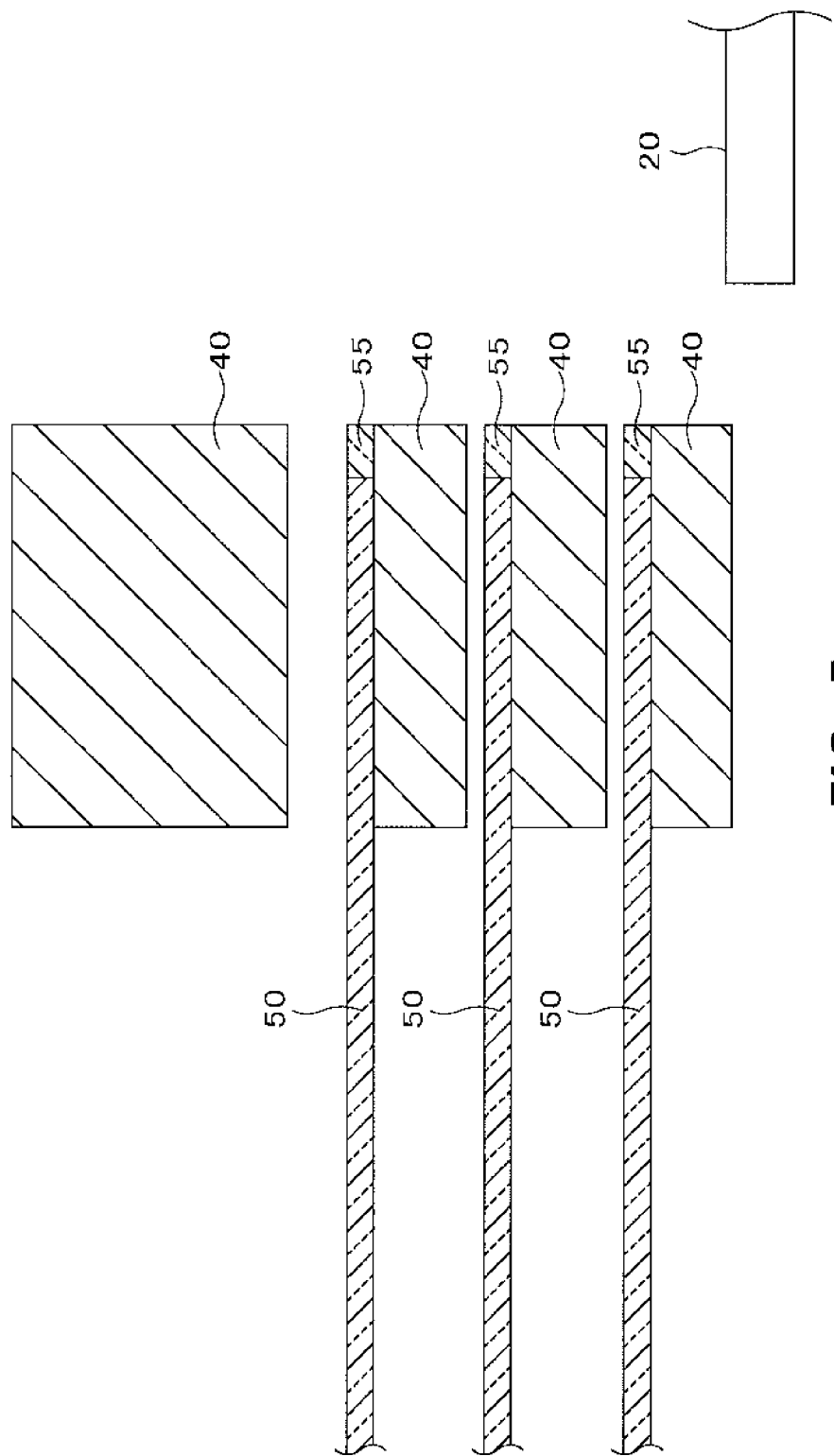
FIG. 5 shows an example of a configuration of the confinement rings 40 and the optical transmitters 50 according to a second modification of the first embodiment.

FIG. 5 shows an example of a configuration of the confinement rings 40 and the optical transmitters 50 according to a second modification of the first embodiment. In the second modification, the optical transmitters 50 are provided in the gaps G between the confinement rings 40, respectively. Also when the optical transmitters 50 are thus provided in the gaps G between the confinement rings 40, respectively, the effects according to the first embodiment can be achieved. Furthermore, there is no need to embed the optical transmitters 50 in the confinement rings 40 in the second modification and thus manufacturing of the apparatus 1 is facilitated.

(Third Modification)

Figure 6:
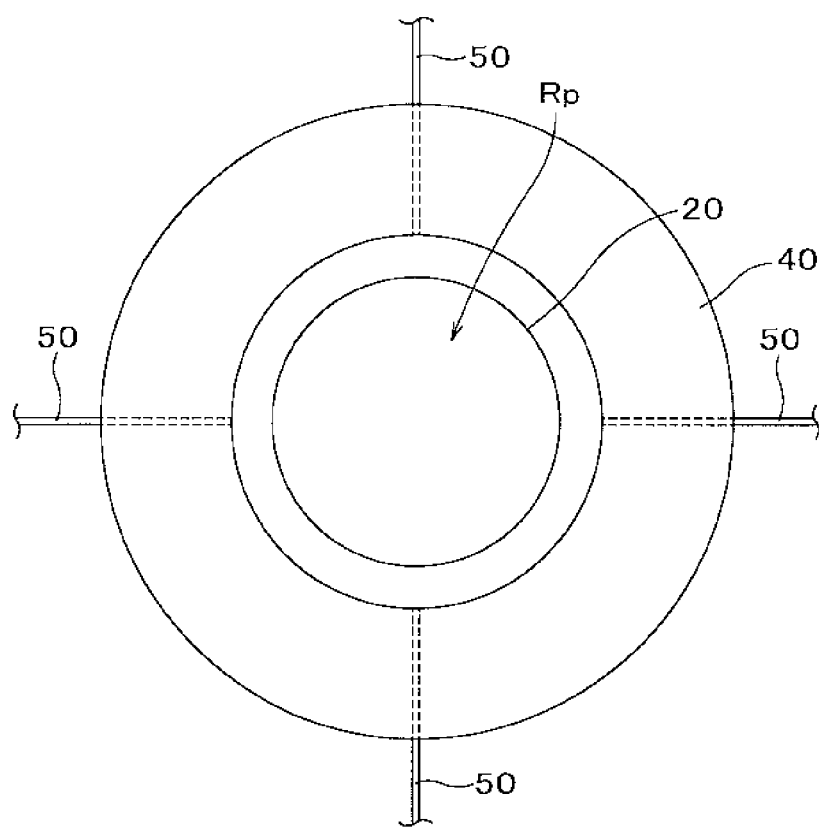
FIG. 6 is a plan view showing an example of a configuration of the confinement rings 40 and the optical transmitters 50 according to a third modification of the first embodiment.

FIG. 6 is a plan view showing an example of a configuration of the confinement rings 40 and the optical transmitters 50 according to a third modification of the first embodiment. In the third modification, the optical transmitters 50 are arranged in a certain one of the confinement rings 40 at different positions (orientations) in directions substantially horizontal to the surface of the stage 20, respectively. The optical transmitters 50 are arranged at positions (orientations) around the plasma generation region Rp, respectively. Accordingly, the optical transmitters 50 can receive plasma emission from various directions. This enables more accurate detection of the end point of etching processing.

The third modification can be combined with the first embodiment. That is, the optical transmitters 50 can be arranged at different positions (heights) in the direction D1 substantially perpendicular to the surface of the stage 20 and arranged at different positions (orientations) in directions substantially horizontal to the surface of the stage 20. This enables still more accurate detection of the end point of etching processing.

Second Embodiment

Figure 7:
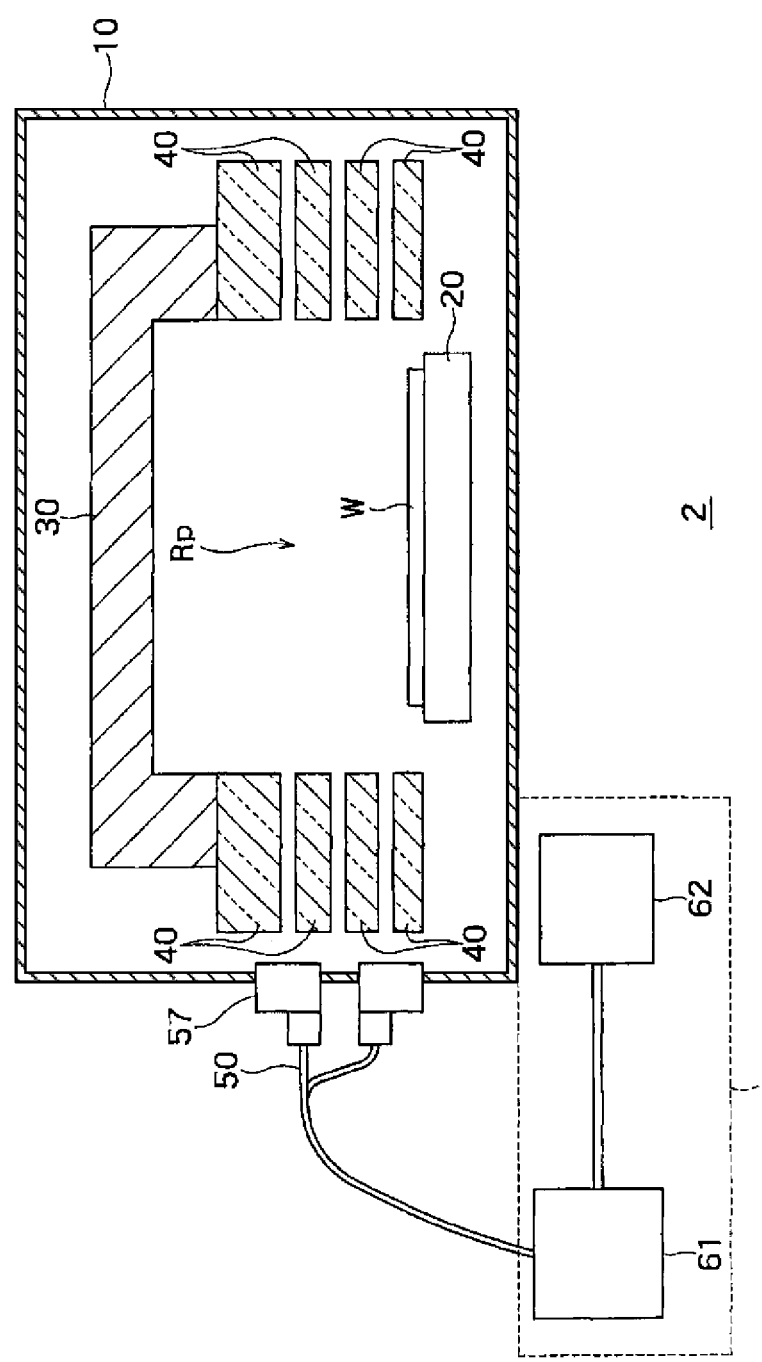
FIG. 7 shows an example of a configuration of a dry etching apparatus 2 according to a second embodiment.

FIG. 7 shows an example of a configuration of a dry etching apparatus 2 (hereinafter, also simply "apparatus 2") according to a second embodiment. In the second embodiment, the confinement rings 40 are formed of a material that transmits therethrough plasma emission. Therefore, the optical transmitters 50 can be provided outside the reaction chamber 10. The reaction chamber 10 has windows (OES windows) 57 for taking in plasma emission and the optical transmitters 50 receive the plasma emission from the windows 57. Other configurations of the apparatus 2 according to the second embodiment can be identical to corresponding configurations of the apparatus 1 according to the first embodiment.

In the second embodiment, the confinement rings 40 are formed of a material that transmits therethrough plasma emission (light larger than 0 nanometer and equal to or smaller than 1000 nanometers, for example). For example, borosilicate glass or sapphire is used for the confinement rings 40. Accordingly, the confinement rings 40 can transmit therethrough plasma emission without blocking the plasma emission. The optical transmitters 50 can receive the plasma emission through the windows 57.

According to the second embodiment, the confinement rings 40 do not interrupt detection of the plasma emission intensities and thus the end point of etching processing can be detected accurately.

Third Embodiment

Figure 8:
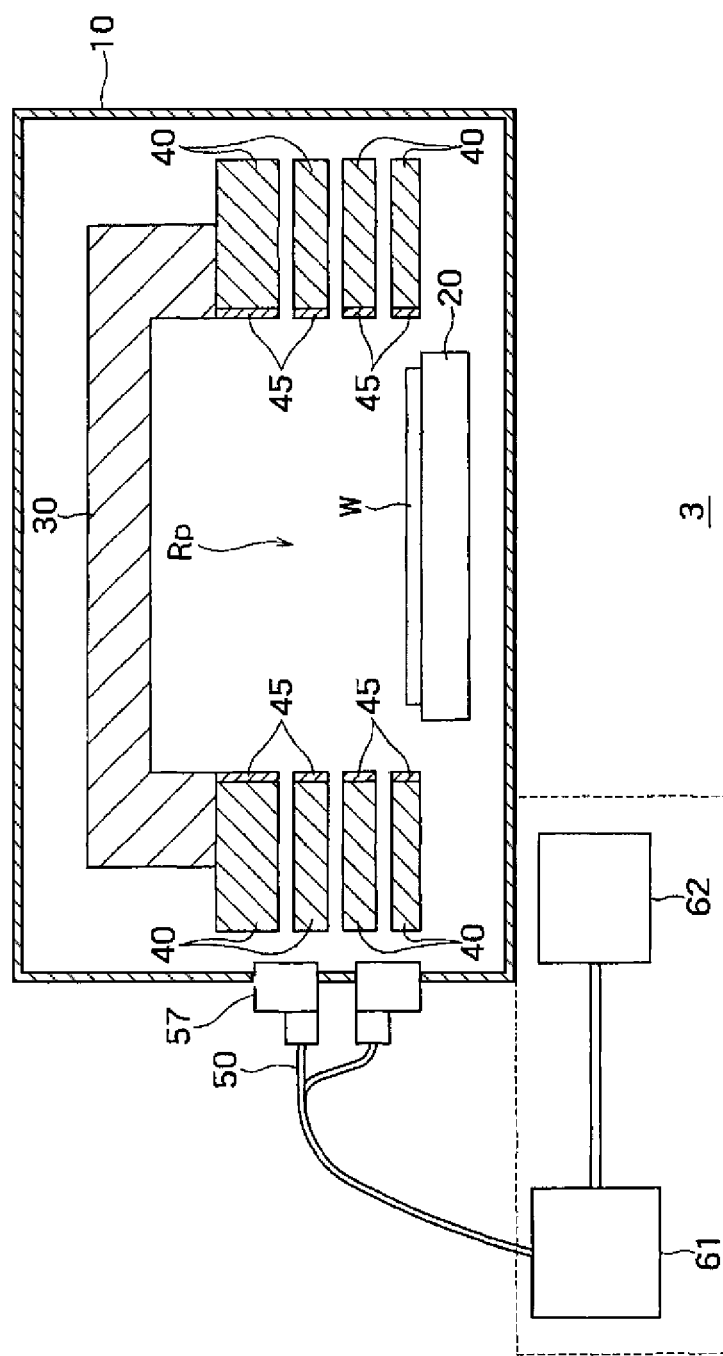
FIG. 8 shows an example of a configuration of a dry etching apparatus 3 according to a third embodiment.

FIG. 8 shows an example of a configuration of a dry etching apparatus 3 (hereinafter, also simply "apparatus 3") according to a third embodiment. In the third embodiment, a dielectric film 45 is provided on side surfaces of the confinement rings 40 on the side of the plasma generation region Rp. The dielectric film 45 is made of a material being lower in the reflectance of plasma emission than the confinement rings 40. That is, the dielectric film 45 functions as an antireflection film. For example, $Al_2O_3$, sapphire, or a silicon nitride film is used for the dielectric film 45. Other configurations of the third embodiment can be identical to corresponding configurations of the second embodiment.

Accordingly, the confinement rings 40 can transmit therethrough plasma emission without reflecting or blocking the plasma emission. The optical transmitters 50 can receive the plasma emission through the windows 57.

According to the third embodiment, the confinement rings 40 do not interfere detection of the plasma emission intensities, and thus can accurately detect the end point of etching processing.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A dry etching method using an etching apparatus, the etching apparatus comprising:
   a chamber configured to contain a substrate therein;
   a mount part configured to have the substrate mounted thereon;
   a plurality of first members provided between an inner wall of the chamber and a plasma generation region above the mount part in planes substantially parallel to a surface of the mount part and arranged in a first direction perpendicular to the substrate along an inner wall of the chamber, the first members being separated from each other with a first gap in the first direction, the first members including openings facing toward a side of the plasma generation region and configured to move in the first direction;
   a group of first optical transmitters respectively having first ends provided on sides of the openings to face the plasma generation region, the first optical transmitters being arranged in the first direction and substantially overlapping each other when seen from the first direction;
   a group of second optical transmitters respectively including first ends provided on sides of the openings to face the plasma generation region, the second optical transmitters being arranged in the first direction and substantially overlapping each other when seen from the first direction, the second optical transmitters being provided in different positions from the first optical transmitters on a same plane parallel to a surface of the mount part;
   an optical analyzer connected to second ends of the first and second optical transmitters outside of the chamber, the second ends being different sides of the first and second optical transmitters, the optical analyzer configured to split plasma emission according to wavelength bands and detect the plasma emission of the respective wavelength bands, the method comprising:
   dry-etching a substrate in the chamber; and
   receiving plasma emission at a plurality of detection points in the plasma generation region using the groups of the first and second optical transmitters during the dry etching.

2. The method of claim 1, further comprising:
   analyzing gas components at the points in the plasma generation region based on an intensity of the plasma emission at the detection points;
   detecting an end of the etching based on changes in the gas components.

3. The method of claim 1, further comprising:
   detecting an end of etching based on a difference between the plasma emission intensities at the detection points in the plasma generation region.

4. The method of claim 1, wherein
   the group of the first optical transmitters includes three or more of the optical transmitters, and
   the group of the second optical transmitters includes three or more of the optical transmitters.

5. The method of claim 1, wherein
   the first and second optical transmitters respectively face each other.

6. The method of claim 1, wherein
   a group of third optical transmitters respectively including first ends provided on sides of the openings to face the plasma generation region, some of the third optical transmitters being arranged in the first direction and substantially overlapping each other when seen from the first direction, the third optical transmitters being provided in different positions from the first and second optical transmitters on a same plane parallel to the surface of the mount part.

7. The method of claim 6, wherein
a group of fourth optical transmitters respectively including first ends provided on sides of the openings to face the plasma generation region, some of the fourth optical transmitters being arranged in the first direction and substantially overlapping each other when seen from the first direction, the fourth optical transmitters being provided in different positions from the first to third optical transmitters on a same plane parallel to the surface of the mount part.

8. The method of claim 7, wherein
the first to fourth optical transmitters are arranged in a cross-shape when seen from the first direction.

9. The method of claim 1, wherein
a diffraction grating is used to split the plasma emission according to wavelength bands, and
CCD elements are used to detect the plasma emission of the respective wavelength bands.

\* \* \* \* \*